US010431307B2

(12) United States Patent
Barth, Jr. et al.

(10) Patent No.: US 10,431,307 B2
(45) Date of Patent: Oct. 1, 2019

(54) ARRAY ORGANIZATION AND ARCHITECTURE TO PERFORM RANGE-MATCH OPERATIONS WITH CONTENT ADDRESSABLE MEMORY (CAM) CIRCUITS

(71) Applicant: INTERNATIONAL BUSINESS MACHINES CORPORATION, Armonk, NY (US)

(72) Inventors: John E. Barth, Jr., Williston, VT (US); Dean L. Lewis, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 34 days.

(21) Appl. No.: 14/962,350

(22) Filed: Dec. 8, 2015

(65) Prior Publication Data
US 2016/0099054 A1 Apr. 7, 2016

Related U.S. Application Data

(63) Continuation of application No. 14/148,083, filed on Jan. 6, 2014, now Pat. No. 9,275,735.

(51) Int. Cl.
*G11C 15/04* (2006.01)
*G11C 15/00* (2006.01)
(52) U.S. Cl.
CPC ............ *G11C 15/046* (2013.01); *G11C 15/00* (2013.01); *G11C 15/04* (2013.01)

(58) Field of Classification Search
CPC ........ G11C 15/046; G11C 15/00; G11C 15/04
USPC .............................................. 365/49.17, 49.1
See application file for complete search history.

(56) References Cited

U.S. PATENT DOCUMENTS

| 4,162,535 | A | 7/1979 | Anderson |
| 4,872,137 | A | 10/1989 | Jennings, III |
| 5,418,923 | A | 5/1995 | Mihara et al. |
| 5,428,773 | A | 6/1995 | Berkovich |
| 5,960,459 | A | 9/1999 | Thome et al. |
| 7,030,787 | B2 | 4/2006 | Cockburn et al. |

(Continued)

OTHER PUBLICATIONS

R. Dean Adams, High Performance Memory Testing: Design Principles, Fault Modeling and Self-Test, 2003, Kluwer Academic Publishers, Chapter 5.*

(Continued)

*Primary Examiner* — Alexander Sofocleous
*Assistant Examiner* — Alfredo Bermudez Lozada
(74) *Attorney, Agent, or Firm* — Steven Meyers; Andrew M. Calderon; Roberts Mlotkowski Safran Cole & Calderon, P.C.

(57) ABSTRACT

An array organization and architecture for a content addressable memory (CAM) system. More specifically, a circuit is provided for that includes a first portion of the CAM configured to perform a first inequality operation implemented between 1 to n CAM entries. The circuit further includes a second portion of the CAM configured to perform a second inequality operation implemented between the 1 to n CAM entries. The first portion and the second portion are triangularly arranged side by side such that the first inequality operation and the second inequality operation are implemented between the 1 to n CAM entries using the same n wordlines.

16 Claims, 7 Drawing Sheets

(56) References Cited

U.S. PATENT DOCUMENTS

| | | | |
|---|---|---|---|
| 7,050,317 B1 * | 5/2006 | Lien | G11C 15/00 365/189.05 |
| 7,502,918 B1 | 3/2009 | Barowski et al. | |
| 2002/0080638 A1 * | 6/2002 | Hata | G11C 15/00 365/49.17 |
| 2004/0233692 A1 * | 11/2004 | Ao | G11C 15/00 365/49.1 |
| 2009/0097294 A1 * | 4/2009 | Wang | G11C 15/04 365/49.17 |
| 2009/0113122 A1 * | 4/2009 | Dosaka | G06F 17/30982 711/108 |
| 2009/0141529 A1 * | 6/2009 | Arsovski | G11C 15/04 365/49.17 |
| 2012/0063189 A1 | 3/2012 | Maurya et al. | |
| 2012/0163059 A1 * | 6/2012 | Singh | G11C 15/04 365/49.1 |

OTHER PUBLICATIONS

R. Dean Adams, High Performance Memory Testing: Design Principles, Fault Modeling and Self-Test, Kluwer Academic Publishers, Chapter 5 (Year: 2003).*

* cited by examiner

ARRAY ORGANIZATION AND ARCHITECTURE TO PERFORM RANGE-MATCH OPERATIONS WITH CONTENT ADDRESSABLE MEMORY (CAM) CIRCUITS

FIELD OF THE INVENTION

The invention relates generally to computer memory systems, and more particularly, relates to an array organization and architecture for a content addressable memory (CAM) system.

BACKGROUND

CAM is a hardware module that either acts as a separate integrated circuit module or is embedded in another integrated circuit such as computer processing unit (CPU). More specifically, CAM is an application specific memory that allows its entire contents to be typically searched within a single clock cycle. CAM typically compares input search data against a table of stored data, and returns the address of the matching data. CAMs having a single clock cycle throughput make them faster than other hardware and software based search systems. Therefore, CAMs can be used in a wide variety of applications requiring high search speeds (e.g., image coding, parametric curve extraction, and Lempel-Ziv compression). The primary commercial application of CAMs today is to classify and forward Internet protocol (IP) packets in network routers.

There are two basic forms of CAM, the binary CAM (BCAM) and ternary CAM (TCAM). Binary CAMs support storage and searching of binary bits, and perform exact-match searches by storing either logic bit "0" or logic bit "1". TCAMs support storing of logic bit "0", logic bit "1", or a don't care logic bit "X". The don't care logic bit acts as a wildcard during searches, and allow TCAM to be attractive for implementing pattern-matching algorithms such as routing table rules (e.g., longest-prefix-match and range-match searches).

SUMMARY

In a first aspect of the invention, a circuit s provided for that includes a first portion of the CAM configured to perform a first inequality operation implemented between 1 to n CAM entries. The circuit further includes a second portion of the CAM configured to perform a second inequality operation implemented between the 1 to n CAM entries. The first portion and the second portion are triangularly arranged side by side such that the first inequality operation and the second inequality operation are implemented between the 1 to n CAM entries using the same n wordlines.

In another aspect of the invention, a circuit is provided for hat includes a first portion of a CAM configured to perform a first inequality operation implemented between 1 to n CAM entries. The 1 to n CAM entries of the first portion are read from left to right. The circuit further includes a second portion of the CAM configured to perform a second inequality operation implemented between the 1 to n CAM entries. The 1 to n CAM entries of the second portion are read from right to left, and the second portion is flipped 180° and triangularly arranged side by side the first portion.

In yet another aspect of the invention, a method is provided for that includes performing a first inequality operation implemented between 1 to n CAM entries using a first portion of a CAM. The method further including performing a second inequality operation implemented between the 1 to n CAM entries using a second portion of the CAM. The first inequality operation and the second inequality operation are performed between the 1 to n CAM entries using the same n wordlines.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates generally to computer memory systems, and more particularly, relates to an array organization and architecture for a content ddressable memory (CAM) system. Generally, ternary CAMs (TCAMs) are used for range matching (e.g., combined inequality functions) and the degenerative operations less-than and greater-than provide for a wide-spread application space. However, when a TCAM is used to implement a range-match function, a lot of cells are wasted in an "always match" state. In embodiments, the present invention excludes these wasted cells from the TCAM by rearranging or reorganizing the traditional TCAM structure to a binary CAM (BCAM) structure. Advantageously, the exclusion of the wasted cells saves the area (i.e., shrinks the footprint that the TCAM takes up on a semiconductor product) and the power otherwise consumed by the TCAM matching the wasted cells.

Figure 1A:
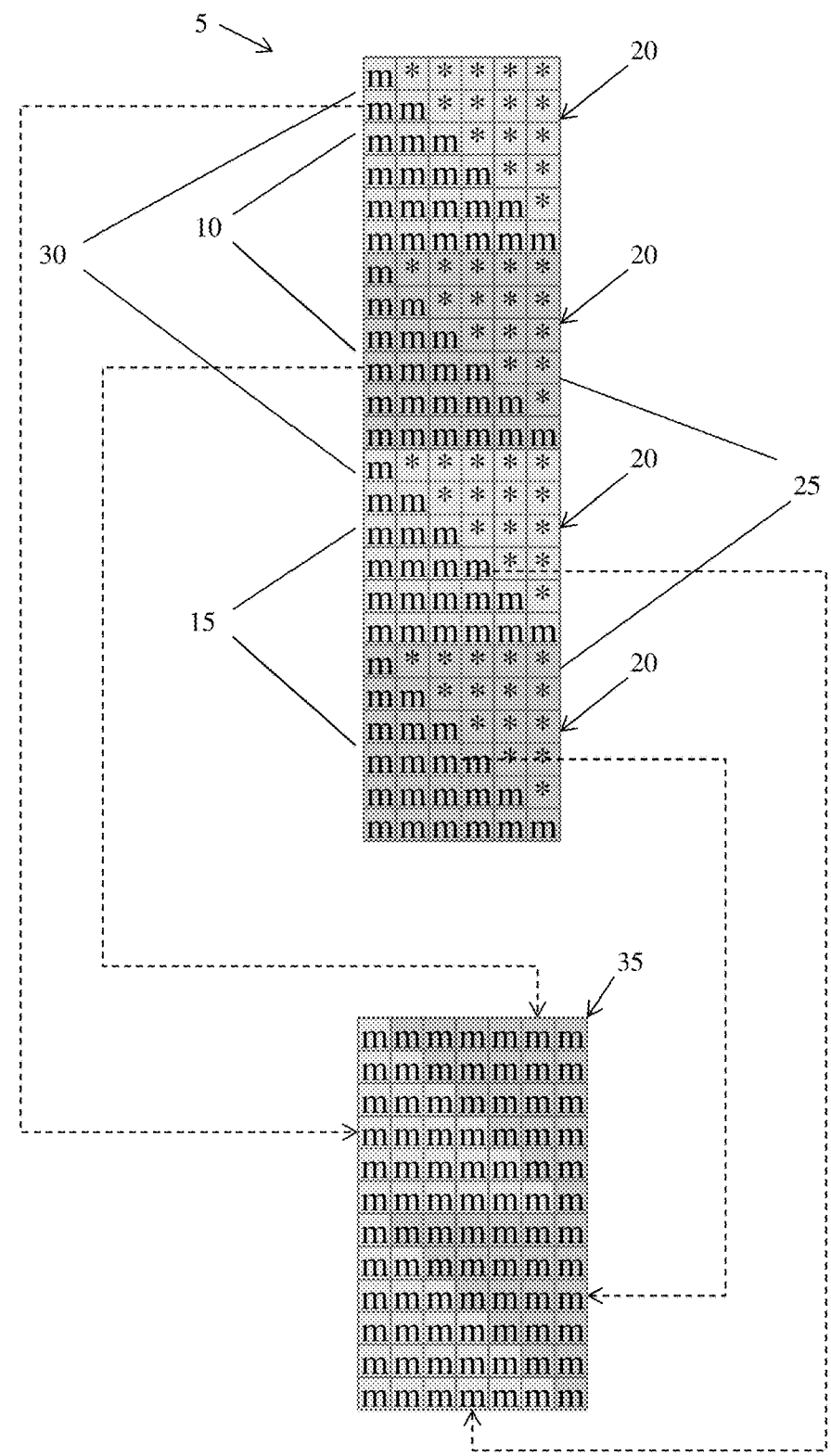
FIGS. 1a and 1b show a generic use of a TCAM to implement range-matching in accordance with aspects of the invention.

FIG. 1a shows a generic use of a TCAM 5 to implement range-matching. The cells of TCAM 5 are arranged into horizontal words (e.g., FIG. 1a shows cell groups 10 and 15 that have 6 word lines and each word line comprises 6 address bits or individual cells). Each cell contains both storage and comparison circuitry for implementing an operation. The cell groups 10 and 15 of color-coded entries indicate a single operation or function, e.g., less-than or greater-than. The output of two groups may be ANDed together to produce a range-match function (e.g., less-than the range max AND greater-than the range min). The cells labeled m are matching either a logic bit "0" or a logic bit "1"; the triangles 20 on the right of each group comprise "always match" cells labeled "*" and are matching a wildcard of don't care logic bits "X" (i.e., always matching because logic bit "X" essential represents logic bit "0" or logic bit "1"), which are generally wasted cells that are implemented for flexibility in traditional TCAM. A less-than or greater-than operation can be implemented in between 1 to n TCAM entries, where n is the address width, so on average n/2 TCAM entries may be used per operation. In contrast, embodiments of the present invention may use n entries per operation. Therefore, in accordance with aspects of the present invention, having F n-entry groups allows for F operations that can be performed. Having F n/2-entry groups in a traditional TCAM does not allow for F operations that can be performed.

Figure 1B:
Figure 1B:
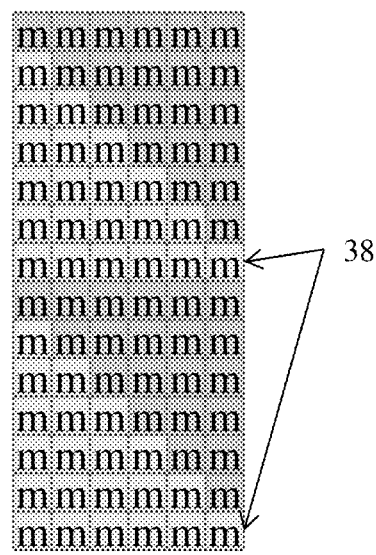

In embodiments, this waste may be observed to create triangular patterns in the TCAM layout, see e.g., the triangular pattern of "*" in FIG. 1a. These triangular patterns of waste may be eliminated by taking the match cells m from the even groupings 25, rotating them 180°, and placing them where the "always match" cells "*" used to be in the odd groupings 30. This is shown in FIG. 1a, with the group color-coding maintained to show how the new layout is achieved. Note that one column 35 (as shown in FIGS. 1a and 1b) may be added in embodiments of the present invention to accommodate this layout, but this is insignificant for any decent-sized memory array. Alternatively, one row 38 (as shown in FIG. 1b) may be added per pair of entries to accommodate the new layout. Importantly, eliminating the don't care cells "*" means this memory array can now be built from BCAM cells instead of traditional TCAM cells (i.e., the use of don't care logic bits "X" is no longer required). Therefore, advantageously, embodiments of the present invention save about 2× area in cell size and about 2× area in operations/entry but require 2× the entries for a total savings of about 50% area for similar functionality.

Figure 2:
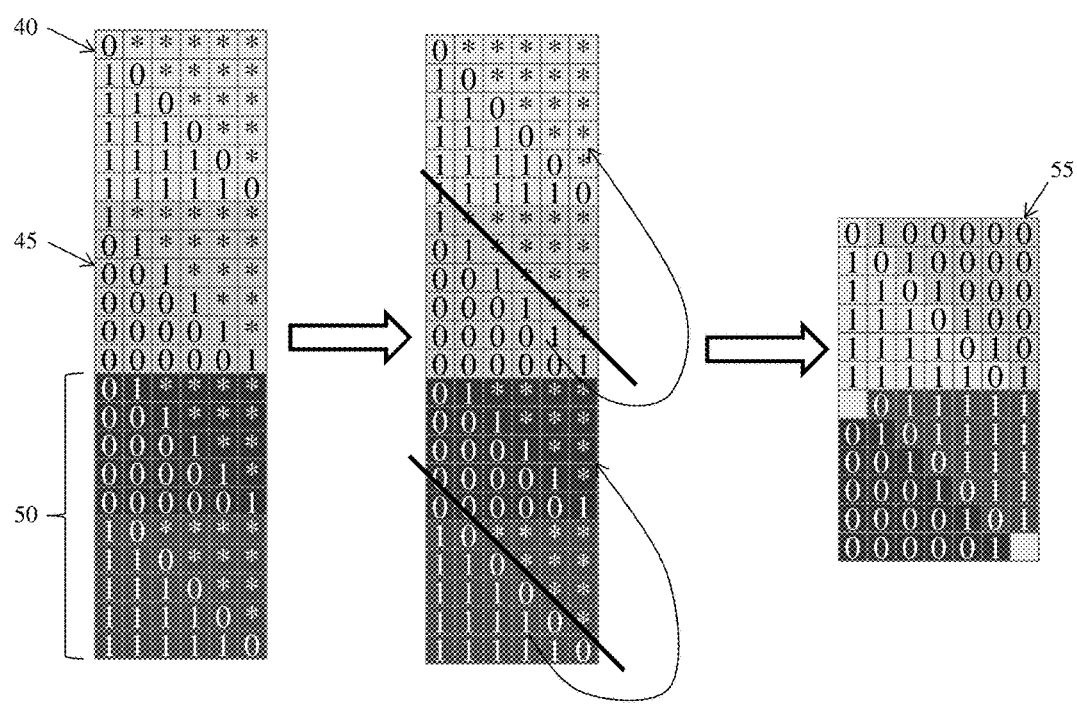
FIG. 2 shows a specific use of a CAM to implement range-matching in accordance with aspects of the invention.

FIG. 2 shows a specific use of a TCAM to implement range-matching (e.g., combined inequality functions) in accordance with aspects of the present invention. The TCAM shown in FIG. 2 comprises a 6-bit address space and group 40 may be configured to detect all numbers less than 63 (e.g., worst-case less than is $<2^6-1$), group 45 may be configured to detect numbers greater than 0 (e.g., worst-case greater than is >0), and group 50 may be configured to detect numbers in the range of 1:62 (e.g., worst-case range is $[1:2^6-2]$). However, one of ordinary skill in the art should understand that the embodiments of the present invention may be implement using any type of address space and is not limit to a 6-bit address space, e.g., a n-bit address space may have inequality functions such that the worst-case less than is $<2^n-1$; the worst-case greater than is >0; and the worst-case range is $[1:2^n-2]$.

As shown in FIG. 2, group 40 illustrates the inequality function worst-case less than is <63, which may be used to search/detect all numbers less than 63. The first 6-bit address space (0***) of group 40 may be configured to detect all numbers from 0-31 (32 numbers), the second 6-bit address space (10) of group 40 may be configured to detect all numbers from 32-47 (16 numbers), the third 6-bit address space (110*) of group 40 may be configured to detect all numbers from 48-55 (8 numbers), the fourth 6-bit address space (1110**) of group 40 may be configured to detect all numbers from 56-59 (4 numbers), the fifth 6-bit address space (11110*) of group 40 may be configured to detect all numbers from 60-61 (2 numbers), and the sixth 6-bit address space (111110) of group 40 may be configured to detect the final number 62 (1 number). Similar function configurations for searching/detecting numbers are illustrated in groups 45 and 50 (e.g., worst-case less than is $<2^6-1$ and worst-case range is $[1:2^6-2]$ respectively), and should be understood by those of ordinary skill in the art.

Implementing these operations in a TCAM structure creates triangle patterns that arise from the binary nature of performing the inequality functions, as discussed herein. These triangular patterns of waste may be eliminated by taking the match cells comprising the "0" and "1" logic bits from the even groupings, rotating them 180°, and placing them where the "always match" cells "*" used to be in the odd groupings. This is shown in FIG. 2, with the group color-coding maintained to show how the new layout is achieved, which may be implemented on a semiconductor chip to achieve a reduction in area taken by the memory array. Note that one column 55 may be added in embodiments of the present invention to accommodate this layout (e.g., expanding to a 7-bit memory array (n+1) from an original 6-bit memory array (n)), but this is insignificant for any decent-sized memory array Eliminating the don't care cells "*" means this memory array can now be built from BCAM cells instead of TCAM cells (i.e., the use of don't care logic bits "X" is no longer required and wasted).

Figure 3:
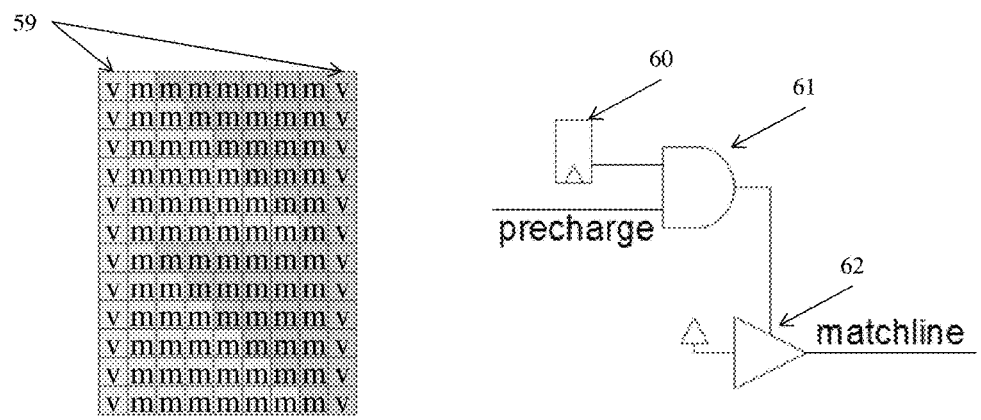
FIG. 3 shows the addition of valid bits to a CAM and a schematic diagram of a latch circuit in accordance with aspects of the invention.

By switching to BCAM, embodiments of the present invention lose a never-match state that is traditionally provided for by TCAM. Because of this, embodiments of the present invention may require a valid bit for each CAM entry. This could be implemented as two extra bits 59 in each CAM word (i.e., one for the left matchline and one for the right matchline) as shown in FIG. 3 left. However, in alternative embodiments, the valid bit may be latched and used to gate the matchline precharge, which may provide a more power-efficient CAM system. This is shown in FIG. 3 right. A valid bit is stored in latch 60 and used to mask the CAM precharge command for that CAM word via the AND gate 61. This prevents the precharge driver 62 from precharging the matchline if a valid pattern is not stored in the associated CAM entry. As should be understood by those of ordinary skill in the art, the contents of this latch 60 would ideally be programmed at the same time as the memory array contents.

Figure 4:
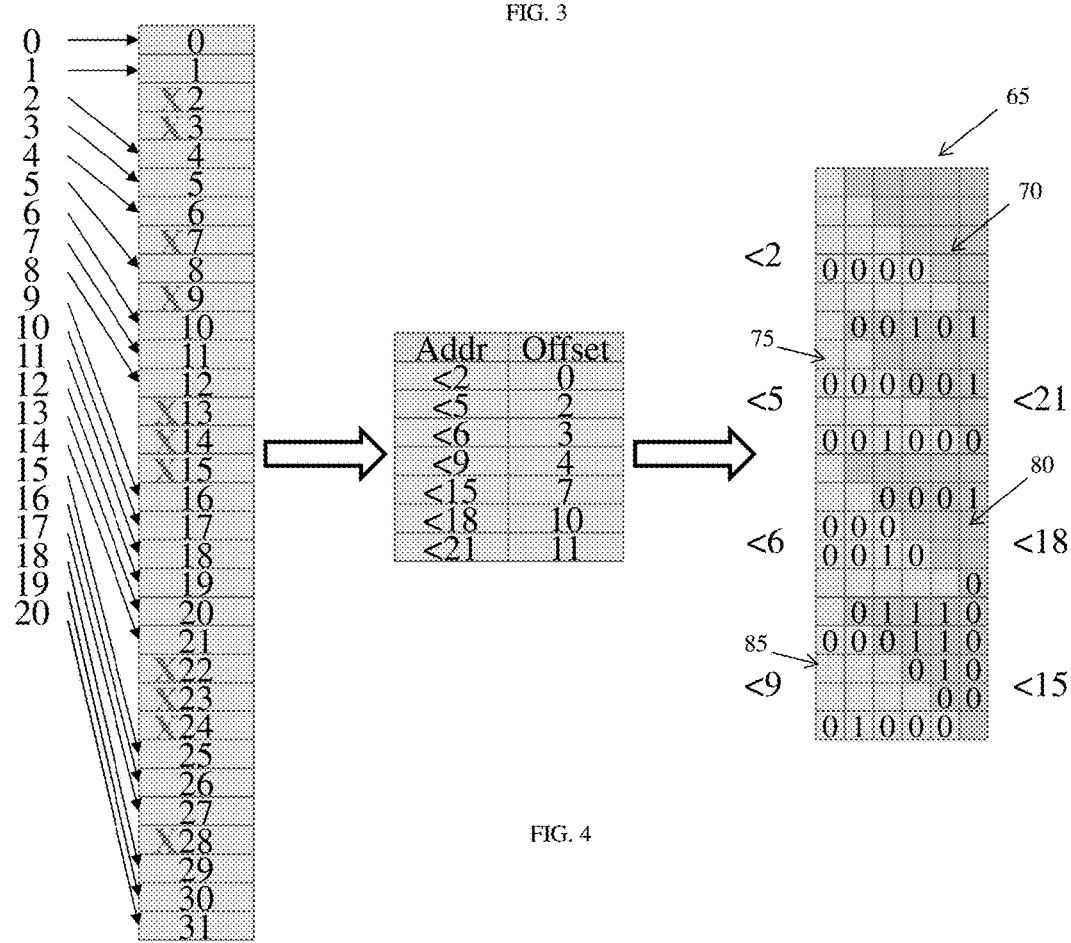
FIG. 4 shows an example application of a CAM to implement range-matching in accordance with aspects of the invention.

FIG. 4 shows an example application of embodiments of the present invention. For example, an operation configured to determine a match between twenty numbers may be mapped such that any number <2 is offset by 0 such that 0 maps to 0 and 1 maps to 1, any number <5 is offset by 2 such that 2 maps to 4, 3 maps to 5, and 4 maps to 6, any number <6 is offset by 3 such that 5 maps to 8, etc. Accordingly, implementing this operation on a silicon layout in accordance with aspects of the present invention, leads to a memory array 65 in which any number <2 is determined by the lighter triangle of the first group 70 matching "0000*". Any number <5 is determined by the lighter triangle of the second group 75 matching "000**" or "0010*". Any number <6 is determined by the lighter triangle of the third group 80 matching "000**" or "0010*". Any number <9 is determined by the lighter triangle of the fourth group 85 matching "00*" or "01000". Any number <15 is determined by the darker triangle of the fourth group 85 matching "00*", "010**", "0110*", or "01110". Any number <18 is determined by the darker triangle of the third group 80 matching "0****" or "1000*". Any number <21 is determined by the darker triangle of the second 75 group matching "100**" or "10100". The darker triangle of the first group 70 is not utilized. As should be understood, the lighter triangles are read left to right and the darker triangles are read right to left. As should also be understood, the "*" characters in the above description are implicit within the memory array 65 and do not occupy actual storage cells.

Figure 5:
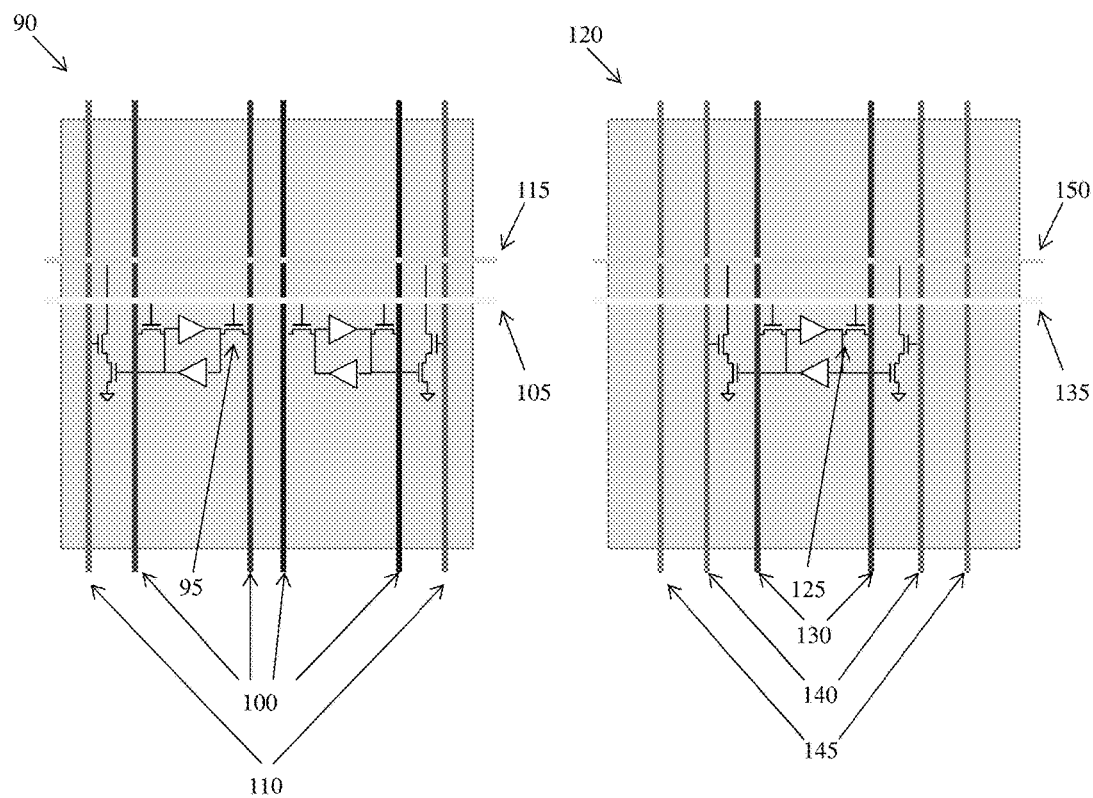
FIGS. 5 and 6 show TCAM and CAM layout diagrams on semiconductor in accordance with aspects of the invention.

In embodiments, the memory array design discussed herein may have implications for the array structure and wiring formed on the silicon. For example, as shown in FIG. 5 left, a traditional TCAM cell 90 may comprise 16 transistors 95 (e.g., storage and comparison circuitry). Left and right bitlines 100 and word line 105 may be used to program the TCAM cell 90. Search lines 110 run vertically though the TCAM cell 90 and broadcast the search data to the TCAM cell 90. Matchline 115 runs horizontally though the TCAM cell 90 and indicates whether the search data matches the cell's logic bit, e.g., "0", "1", "X". An activated matchline indicates a match and a deactivated matchline indicates a non-match or a mismatch. The matchline 115 may be configured as an input to an encoder (not shown) that generates an address corresponding to the match location.

In embodiments, as shown in FIG. 5 right, a BCAM cell 120 may comprise 10 transistors 125 (e.g., BCAM cells require less storage and comparison circuitry than TCAM cells). Left and right bitlines 130 and word line 135 may be used to program the BCAM cell 120. Search lines 140 and passing search lines 145 run vertically though the BCAM cell 120 and broadcast the search data to the BCAM cell 120. Matchline 150 runs horizontally though the BCAM cell 120 and indicates whether the search data matches the cell's logic bit, e.g., "0", "1". An activated matchline indicates a match and a deactivated matchline indicates a non-match or a mismatch. The matchline 150 may be configured as an input to an encoder (not shown) that generates an address corresponding to the match location.

As shown in FIG. 5, two pairs of searchlines (i.e., search lines 140 and passing search lines 145) may be required per column of cells in embodiments comprising the BCAM cell 120 instead of one pair of search lines (i.e., search lines 110) per column of cells as in the traditional TCAM cell 90. However, the reduction in transistors from 16 in the traditional TCAM cell to 10 in embodiments comprising the BCAM cell 120 advantageously provide less complex circuitry and a reduced silicon footprint (i.e., less area is taken up by the BCAM cells because of the reduction in the number of transistors). As should be understood by those of ordinary skill in the art, the TCAM cell 90 and BCAM cell 120 may be implemented using other components than transistors, e.g., latches, while still falling within the spirit and scope of the invention and achieving a reduction in silicon area.

Figure 6:
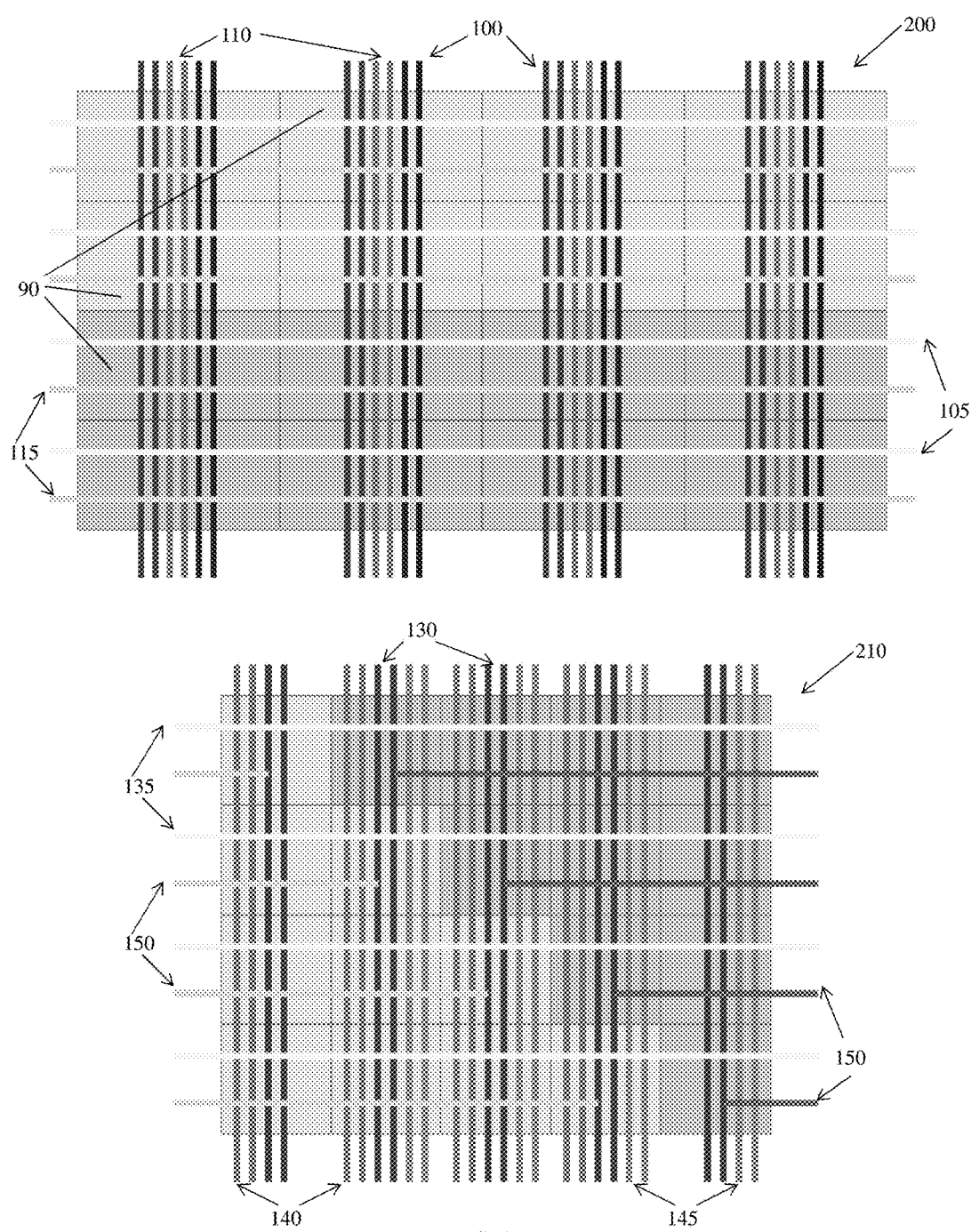

As shown in FIG. 6 top, a traditional TCAM 200 configured using multiple TCAM cells 90, as shown in FIG. 5, may comprise left and right bitlines 100, word lines 105, search lines 110, and matchlines 115. As shown in FIG. 6 bottom, a CAM 210 implemented in accordance with aspects of the present invention may be configured using multiple BCAM cells 120, as shown in FIG. 5, and may comprise left and right bitlines 130, word lines 135, search lines 140, passing search lines 145, and left and right matchlines 150. Accordingly, as should be understood by those of ordinary skill in the art, the CAM implementation in accordance with aspects of the present invention requires right and left matchlines 150 (i.e., a set of matchlines for the lighter triangle and a set of match lines for the darker triangle) and two sets of search lines (i.e., a set of search lines for the lighter triangle and a set of passing search lines for the darker triangle). However, no extra tracks are required for the CAM implementation. Instead, the track density simply doubles because the BCAM cells are half the size of the TCAM cells.

More specifically, implications of embodiments of the present invention comprising a reorganized CAM include twice as many matchlines as those of the traditional TCAM but a same number of matchline tracks since the matchlines exit on both sides of the array. Additionally, the reorganized CAM includes twice the number of search lines (e.g., one set left to right for the lighter triangle and one set right to left for the darker triangle) but a same number of tracks since the bitlines are reduced to a single set. Alternatively, a double-pump CAM may be used and only half the matchlines may be precharged. Additionally, a worst case number of CAM entries for the reorganized CAM requires n entries for n-bit addresses as compared to n/2 in an average case for a traditional TCAM. Additionally, one column or row is required to be added to accommodate the reorganized layout but this is insignificant for any decent-sized memory array. Additionally, traditional TCAM cells comprising a large number of circuitry component (e.g., transistors) is cut approximately in half using reorganized CAM cells that essentially function as BCAM cells. Consequently, embodiments of the present invention advantageously save about 2× area in cell size and about 2× area in operations/entry but require 2× the entries for a total savings of about 50% area for similar functionality.

Figure 7:
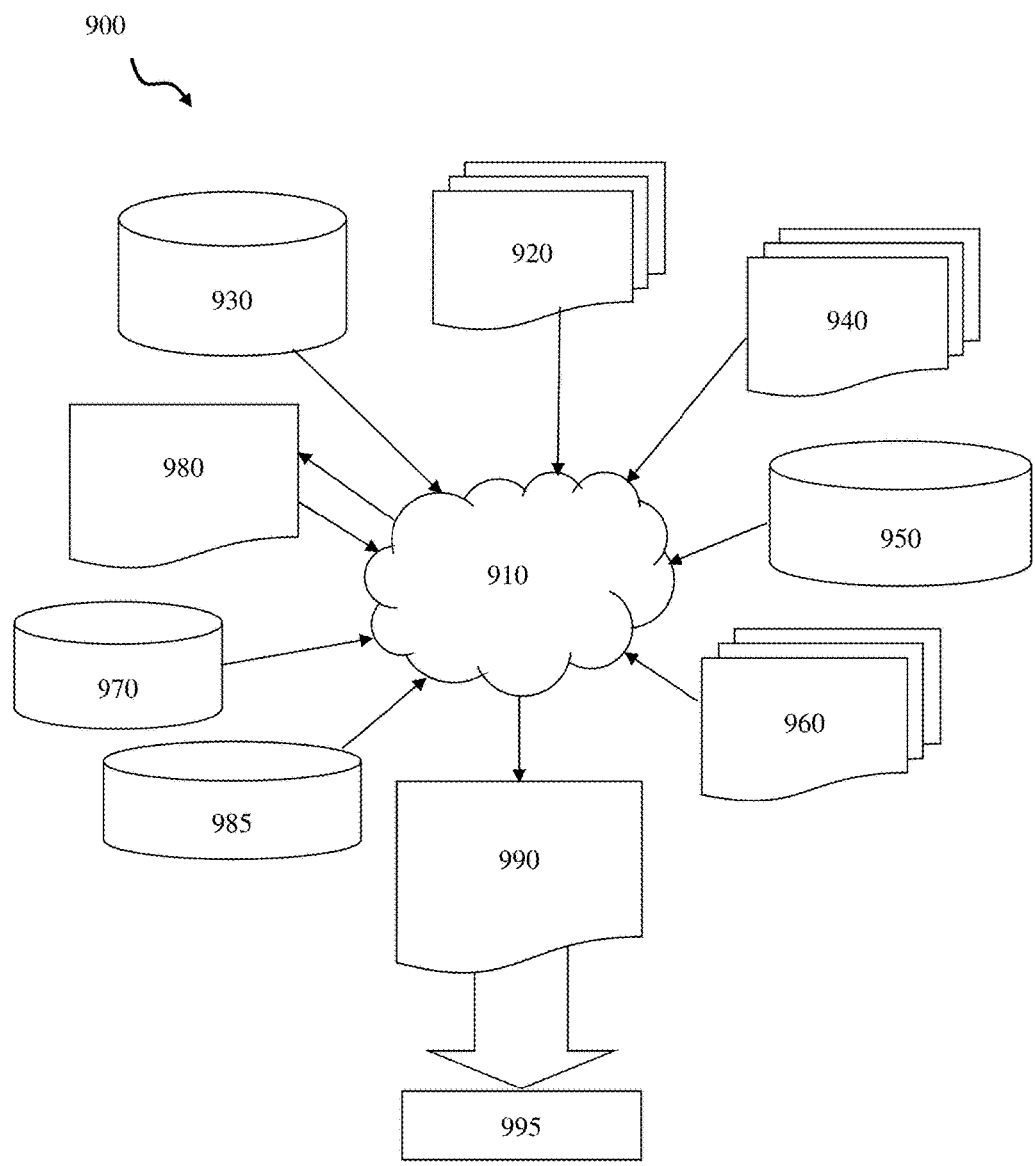
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a, 1b, and 2-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures in any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a, 1b, and 2-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a, 1b, and 2-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a, 1b, and 2-6. In one embodiment, design structure 990 may comprise a compiled, executable HDL simulation model that functionally simulates the devices shown in FIGS. 1a, 1b, and 2-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a, 1b, and 2-6. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
   a first portion of a content addressable memory (CAM) configured to perform a first inequality operation implemented between 1 to n CAM entries, wherein the 1 to n CAM entries of the first portion are read from left to right to perform the first inequality operation;
   a second portion of the CAM configured to perform a second inequality operation implemented between the 1 to n CAM entries, wherein the 1 to n CAM entries of the second portion are read from right to left to perform the second inequality operation;
   a first matchline configured to indicate a match or mismatch for each of the 1 to n CAM entries implemented in the first portion; and
   a second matchline configured to indicate a match or mismatch for each of the 1 to n CAM entries implemented in the second portion,
   wherein the first portion and the second portion are triangularly arranged side by side such that the first inequality operation and the second inequality operation are implemented between the 1 to n CAM entries using the same n wordlines,
   wherein two valid bits are provided for each of the 1 to n CAM entries as extra bits, in addition to data bits defining each of the 1 to n CAM entries, to indicate that the data bits defining each of the 1 to n CAM entries comprise a valid pattern,
   wherein the first and second portions of the CAM are each comprised of binary CAM (BCAM) cells,
   wherein, for each 1 to n CAM entry, the valid bit is latched in a latch circuit, wherein the latch circuit is coupled to a precharge driver for the first and second matchlines such that the first and second matchlines will only be precharged when the valid bit for a corresponding one of the 1 to n CAM entries is latched in the latch circuit, and
   wherein, for each 1 to n CAM entry, one valid bit is provided for the first matchline and another valid bit is provided for the second matchline.

2. The circuit of claim 1, wherein the CAM is n+1 bits wide or the CAM includes an additional row per pair of the first inequality operation and the second inequality operation.

3. The circuit of claim 1, wherein a first output of the first portion and a second output of the second portion are ANDed together to produce a range-match function.

4. The circuit of claim 1, wherein the second portion is flipped 180° relative to the first portion.

5. The circuit of claim 4, wherein the CAM is n+1 bits wide or the CAM includes an additional row per pair of the first inequality operation and the second inequality operation.

6. The circuit of claim 1, wherein the first matchline and the second matchline are located in a same wire track.

7. The circuit of claim 1, further comprising a first set of search lines configured to broadcast search data to the first portion and a second set of search lines configured to broadcast the search data to the second portion.

8. The circuit of claim 7, wherein at least one cell of the CAM comprises both the first set of search lines and the second set of search lines running through the at least one cell.

9. The circuit of claim 7, wherein at least one column of the CAM comprises both the first set of search lines and the second set of search lines running through the at least one column.

10. The circuit of claim 7, wherein:
    at least one column of the CAM comprises both the first set of search lines and the second set of search lines running through the at least one column;
    a left most column of the CAM comprises only the first set of search lines; and
    a right most column of the CAM comprises only the second set of search lines.

11. The circuit of claim 1, wherein the BCAM cells at adjacent edges of the first and second portions are directly adjacent to one another without any ternary CAM (TCAM) "always match" cells interposed between adjacent edges of the first and second portions.

12. The circuit of claim 1, wherein the circuit is implemented on a semiconductor chip.

13. The circuit of claim 12, further comprising a first set of search lines configured to broadcast search data to the first portion and a second set of search lines configured to broadcast the search data to the second portion, wherein the first and second portions of the CAM are each comprised of binary CAM (BCAM) cells, the second portion is flipped 180° relative to the first portion, the CAM is n+1 bits wide or the CAM includes an additional row per pair of the first inequality operation and the second inequality operation, and at least one cell of the CAM comprises both the first set of search lines and the second set of search lines running through the at least one cell.

14. The circuit of claim 13, wherein the BCAM cells are each comprised of no more than 10 transistors, and the BCAM cells at adjacent edges of the first and second portions are directly adjacent to one another without any ternary CAM (TCAM) "always match" cells interposed between adjacent edges of the first and second portions.

15. The circuit of claim 1, wherein the first inequality operation is a less-than or greater-than operation, and the second inequality operation is a less-than or greater-than operation.

16. The circuit of claim 1, wherein:
    a first output of the first portion and a second output of the second portion are ANDed together to produce a range-match function;
    the second portion is flipped 180° relative to the first portion;
    the first matchline and the second matchline are located in a same wire track;
    the BCAM cells at adjacent edges of the first and second portions are directly adjacent to one another without any ternary CAM (TCAM) "always match" cells interposed between adjacent edges of the first and second portions;
    the BCAM cells are each comprised of no more than 10 transistors; and
    the circuit further comprises a first set of search lines configured to broadcast search data to the first portion and a second set of search lines configured to broadcast the search data to the second portion.

* * * * *